(12) United States Patent
Shu

(10) Patent No.: US 11,349,028 B2
(45) Date of Patent: May 31, 2022

(54) SEMICONDUCTOR DEVICE WITH GATE CUT STRUCTURE

(71) Applicant: GLOBALFOUNDRIES U.S. INC., Santa Clara, CA (US)

(72) Inventor: Jiehui Shu, Clifton Park, NY (US)

(73) Assignee: GlobalFoundries U.S. Inc., Malta, NY (US)

(*) Notice: Subject to any disclaimer, the term of this patent is extended or adjusted under 35 U.S.C. 154(b) by 0 days.

(21) Appl. No.: 16/568,242

(22) Filed: Sep. 11, 2019

(65) Prior Publication Data
US 2021/0074842 A1 Mar. 11, 2021

(51) Int. Cl.
| H01L 29/78 | (2006.01) |
| H01L 29/417 | (2006.01) |
| H01L 21/8234 | (2006.01) |
| H01L 29/66 | (2006.01) |
| H01L 29/49 | (2006.01) |

(52) U.S. Cl.
CPC .... *H01L 29/785* (2013.01); *H01L 21/823431* (2013.01); *H01L 29/41791* (2013.01); *H01L 29/495* (2013.01); *H01L 29/6681* (2013.01)

(58) Field of Classification Search
CPC ............. H01L 29/785; H01L 29/41791; H01L 29/6681; H01L 21/823878
See application file for complete search history.

(56) References Cited

U.S. PATENT DOCUMENTS

| 9,064,932 | B1* | 6/2015 | Pham ................ H01L 29/66545 |
| 9,536,793 | B1* | 1/2017 | Zhang ............. H01L 21/823828 |
| 9,721,848 | B1* | 8/2017 | Bu .................... H01L 29/66545 |
| 9,812,365 | B1 | 11/2017 | Zhang et al. |
| 9,837,276 | B2 | 12/2017 | Greene et al. |
| 10,236,213 | B1 | 3/2019 | Pandey et al. |
| 10,276,676 | B1* | 4/2019 | Liang ................ H01L 29/42356 |
| 2016/0056181 | A1* | 2/2016 | Anderson ............ H01L 21/845 257/347 |
| 2016/0181425 | A1* | 6/2016 | Bai ................... H01L 29/66818 438/283 |

\* cited by examiner

*Primary Examiner* — Vincent Wall
(74) *Attorney, Agent, or Firm* — David Cain

(57) ABSTRACT

A semiconductor device comprising a substrate with a first fin and a second fin disposed on the substrate. A gate electrode is over the first fin and the second fin. A gate-cut pedestal is positioned between the first fin and the second fin, the gate-cut pedestal having side surfaces and a top surface. A portion of the side surfaces of the gate-cut pedestal is covered by the gate electrode. The gate-cut pedestal has a height that is substantially similar to a height of the first fin or the second fin.

11 Claims, 11 Drawing Sheets

SEMICONDUCTOR DEVICE WITH GATE CUT STRUCTURE

FIELD OF THE INVENTION

The disclosed embodiments relate generally to semiconductor device fabrication, and more particularly to a gate cut structure for a semiconductor device.

BACKGROUND

Fin-type field effect transistors (FinFETs) are formed by creating a number of semiconductor fins on a substrate and placing a gate conductor perpendicularly across the fins. A finFET is created by the gate forming a channel region below the gate in the fin, and source/drain regions formed in the fin aside the gate. In order to form the various portions of the finFET according to a replacement metal gate (RMG) approach, an elongated dummy gate is put in place where the metal gate conductor will eventually be placed perpendicularly across the fins. The dummy gate allows for processing such as anneals to be carried out without damaging the final gate conductor material. As part of the process, a gate cut opening is formed in the dummy gate, and is then filled with a gate cut fill. To form the finFETs, the dummy gate is removed and replaced with a metal gate conductor that extends over adjacent fins. The gate cut fill creates a structure that provides electrical isolation between gates of adjacent finFETs to electrically isolate the finFETs.

As semiconductor device fabrication continues to scale to smaller technology nodes, spacing between structures continues to decrease and the aspect ratio for the gate cut opening continues to increase. The narrow width and the high aspect ratio for a gate cut opening for finFETs make it difficult to remove dummy gate material residue at the bottom of the opening with conventional reactive ion etch (RIE). Hence, there is an urgent need to overcome the challenges mentioned above.

SUMMARY

In an aspect of the disclosure, a semiconductor device is provided. The semiconductor device comprises a substrate with a first fin and a second fin disposed on the substrate. A gate electrode is over the first fin and the second fin. A gate-cut pedestal is positioned between the first fin and the second fin, the gate-cut pedestal having side surfaces and a top surface. A portion of the side surfaces of the gate-cut pedestal is covered by the gate electrode. The gate-cut pedestal has a height that is substantially similar to a height of the first fin or the second fin.

In another aspect of the disclosure, a semiconductor device is provided. The semiconductor device comprises a substrate with a first fin and a second fin disposed on the substrate. A gate electrode is over the first fin and the second fin. A dielectric gate-cut pedestal is positioned between the first fin and the second fin, the dielectric gate-cut pedestal having side surfaces and a top surface that are covered by the gate electrode. The dielectric gate-cut pedestal has a height that is substantially similar to a height of the first fin or the second fin.

In yet another aspect of the disclosure, a method to fabricate a semiconductor device is provided. The method comprises providing a first fin and a second fin disposed on a substrate. A dielectric liner is deposited between the first fin and the second fin. A first dielectric layer is deposited to cover a portion of the dielectric liner between the first and second fins to form a gate-cut pedestal. The uncovered portions of the dielectric liner are subsequently removed. A metal contact layer is deposited over the gate-cut pedestal, the first fin and the second fin. An opening is formed in the metal contact layer to expose side surfaces and a top surface of the gate-cut pedestal. A second dielectric layer is deposited in the opening in the metal contact layer to cover the side and top surfaces of the gate-cut pedestal to form a gate-cut block.

Numerous advantages may be derived from the embodiments described below. After the formation of the gate-cut pedestal and prior to the deposition of the metal contact layer, a gate electrode layer may be deposited over the gate-cut pedestal, the first fin and the second fin. The metal contact layer may subsequently be deposited over the gate electrode layer and an opening may be formed in the metal contact layer to expose the gate electrode layer over the side surfaces and the top surface of the gate-cut pedestal. The gate electrode layer over the side surfaces and the top surface of the gate-cut pedestal may be removed. The second dielectric layer may be deposited to fill up the opening, forming the gate-cut block. The gate-cut block may be wider than the gate-cut pedestal. By depositing the gate electrode layer and the metal contact layer prior to forming the gate-cut block, the challenge of depositing the gate electrode layer and the metal contact layer in a narrow spacing between the gate-cut block and the first fin or the second fin is avoided. Hence, there is more uniform coverage of the metal gate conductors i.e., the gate electrode and the metal contact layer.

BRIEF DESCRIPTION OF THE DRAWINGS

The disclosed embodiments will be better understood from a reading of the following detailed description, taken in conjunction with the accompanying drawings.

Figure 1:
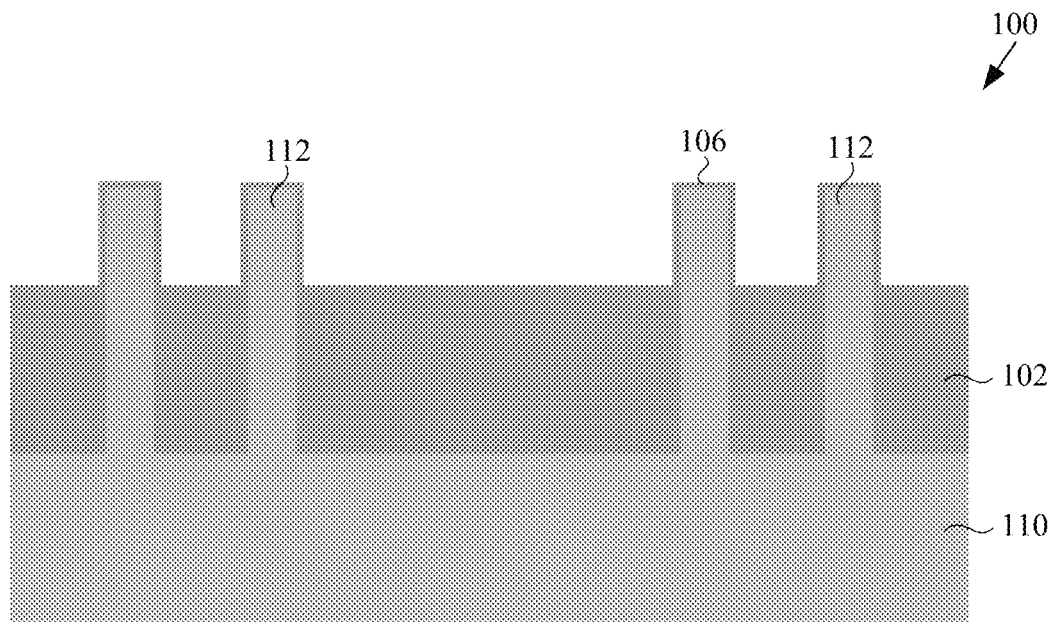
FIG. 1 is a cross-section view of a partially completed semiconductor device according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

FIG. 1 is a cross-section view of a partially completed semiconductor device 100 according to an embodiment of the disclosure. Referring to FIG. 1, the semiconductor device 100 comprises a plurality of fins 112 disposed on a substrate 110, and the fins 112 are separated by an isolation material 102. A dielectric layer 106 is formed covering sidewalls and top surfaces of the fins 112.

The fins 112 generally define active regions for forming source and drain regions and channel regions underneath gate structures for the semiconductor device 100. While the fins 112 define active regions for the semiconductor device 100 in the present disclosure, it should be noted that the fin 112 is used only as a non-limiting example of an active region. Other active regions (e.g., a doped layer on a top surface of a bulk semiconductor substrate or a semiconductor-on-insulator layer, etc.) may be used for different types of transistor devices In accordance with the embodiment in FIG. 1, the substrate 110 may include any appropriate semiconductor material, such as silicon, silicon germanium, silicon carbon, other II-VI or III-V semiconductor compounds and the like. In an embodiment, the semiconductor material of the substrate 110 may be silicon. The isolation material 102 may include any suitable insulating material, such as silicon dioxide or silicon nitride. In an embodiment, the isolation material 102 is a shallow trench isolation (STI). The insulating material in the shallow trench isolation is preferably silicon dioxide. The dielectric layer 106 may be made of silicon dioxide. The dielectric layer 106 may be formed by thermal oxidation, chemical vapor deposition (CVD), physical vapor deposition (PVD) or atomic layer deposition (ALD).

Figure 2:
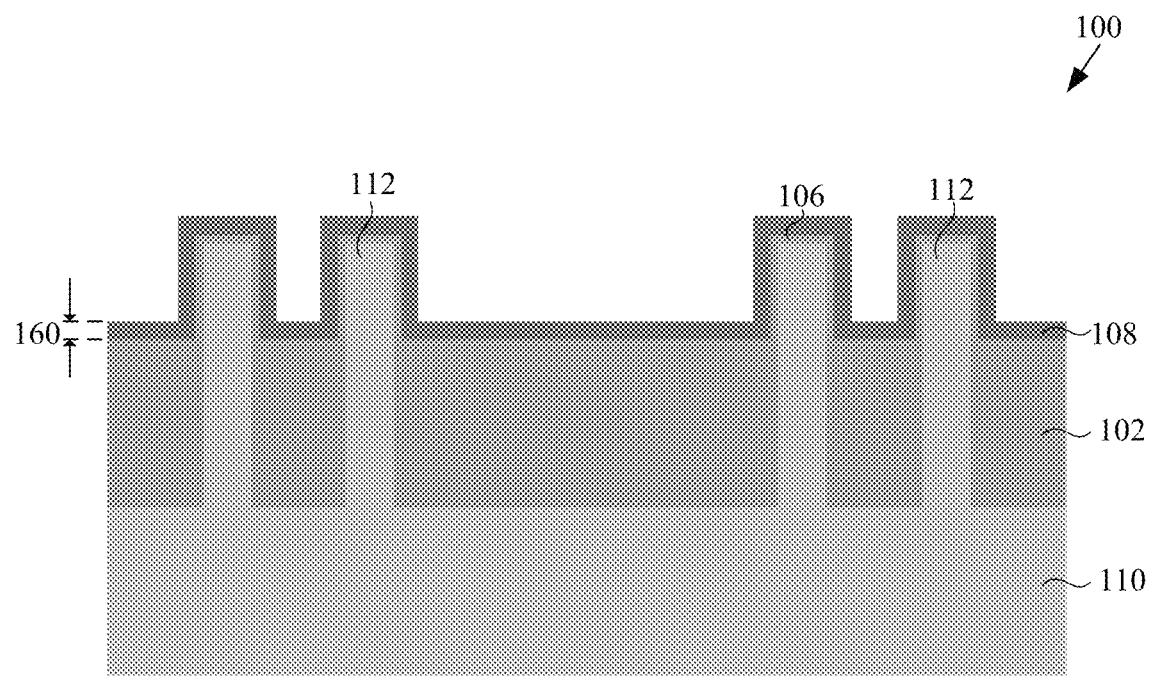
FIG. 2 is a cross-section view of a partially completed semiconductor device after deposition of a dielectric liner, according to an embodiment of the disclosure.

FIG. 2 follows from FIG. 1 after conformal deposition of a dielectric liner 108 over the plurality of fins 112 and the isolation material 102 between the fins 112, in accordance with an embodiment of the disclosure. The dielectric liner 108 may be made of aluminum oxide ($Al_2O_3$), titanium oxide ($TiO_2$) or any other suitable material. The dielectric liner 108 may be deposited by CVD, PVD, ALD or any other suitable deposition methods. The thickness 160 of the deposited dielectric liner 108 ranges between 1 nm-10 nm, and preferably between 2 nm-5 nm.

Figure 3:
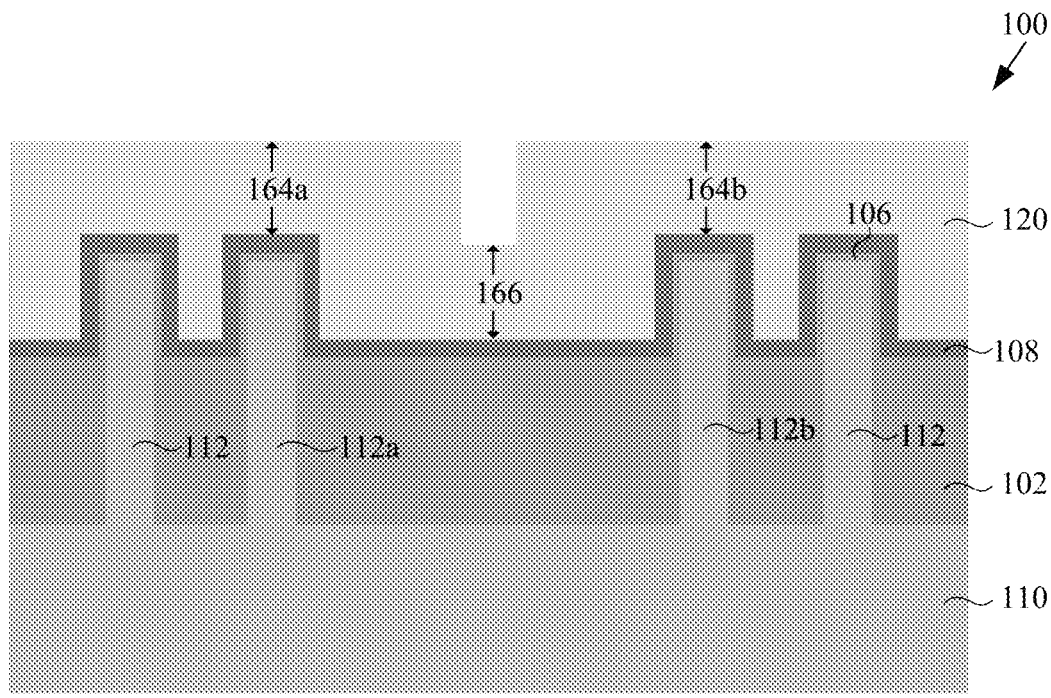
FIG. 3 is a cross-section view of a partially completed semiconductor device after deposition of a patterning layer, according to an embodiment of the disclosure.

FIG. 3 follows from FIG. 2 after conformal deposition of a patterning layer 120 over the dielectric liner 108 over the plurality of fins 112 including a first fin 112a and a second fin 112b and the isolation material 102, in accordance with an embodiment of the disclosure. The patterning layer 120 may be made of amorphous silicon and may be deposited by CVD, PVD, ALD or any other suitable deposition methods. The patterning layer 120 thicknesses over the first fin 112a, the second fin 112b and the isolation material 102, 164a, 164b and 166, respectively, may be substantially equal. The thicknesses 164a, 164b and 166 of the patterning layer 120 ranges between 10 nm-100 nm, and preferably between 20 nm-50 nm.

Figure 4:
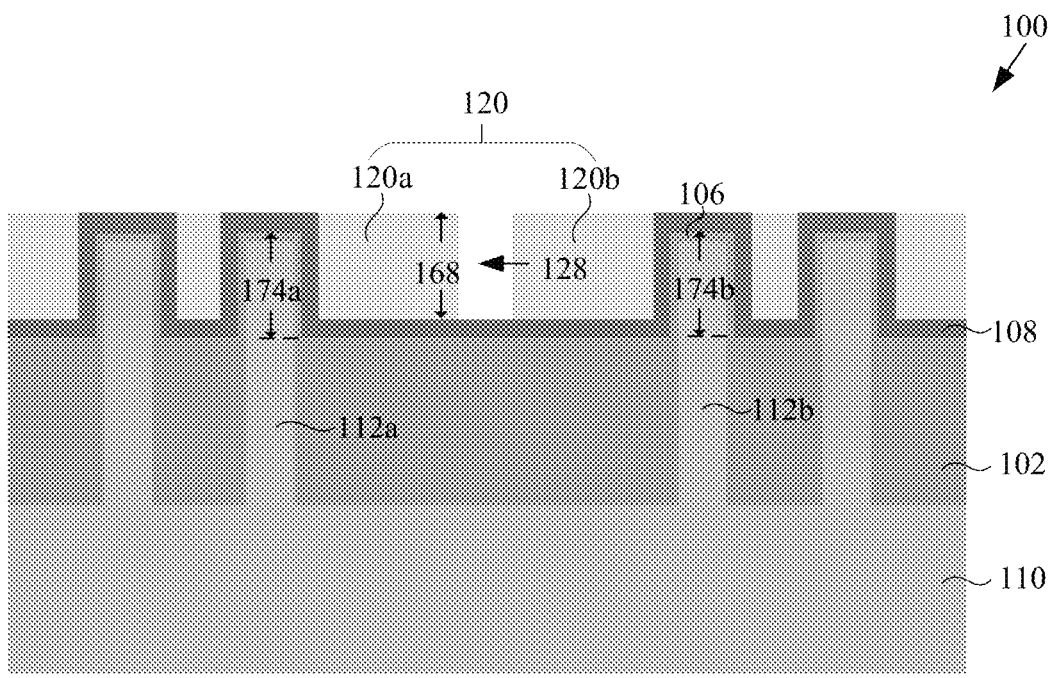
FIG. 4 is a cross-section view of a partially completed semiconductor device after formation of an opening in the patterning layer, according to an embodiment of the disclosure.

FIG. 4 follows from FIG. 3 after anisotropic etching of the patterning layer 120 to form an opening 128 separating the patterning layer 120a over the first fin 112a and the patterning layer 120b over the second fin 112b, in accordance with an embodiment of the disclosure. In an embodiment, the anisotropic etching may be a dry etch process. The patterning layer 120a over the first fin 112a and the patterning layer 120b over the second fin 112b may collectively be referred to as patterning layer 120. The opening 128 in the patterning layer 120 exposes the dielectric liner 108 between the first fin 112a and the second fin 112b. The dielectric liner 108 serves as an etch stop layer. The opening 128 in the patterning layer 120 has a height 168 which may be substantially equal to a height 174a of the first fin 112a or a height 174b of the second fin 112b. Hence, it is easier to remove patterning layer 120 residue in a bottom of the opening 128 due to a relatively lower height, and hence lower aspect ratio of the opening 128.

The term "anisotropic etching" refers to etching which does not proceed in all directions at the same rate. If etching proceeds exclusively in one direction (e.g., only vertically), the etching process is said to be completely anisotropic.

Figure 5:
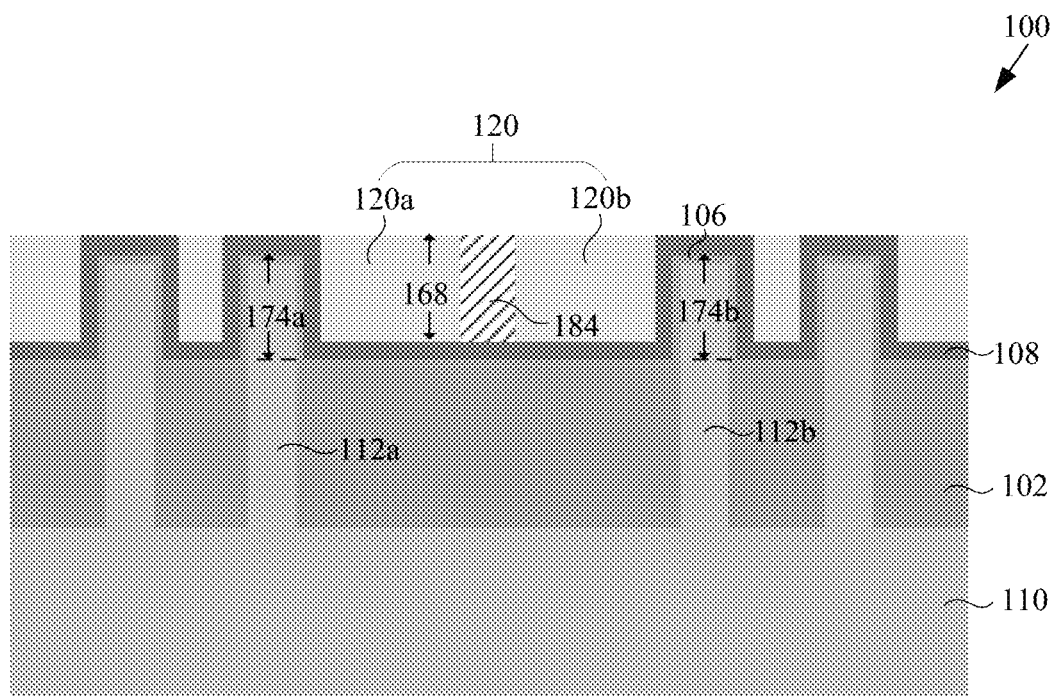
FIG. 5 is a cross-section view of a partially completed semiconductor device after deposition of a first dielectric layer in the opening in the patterning layer to form a gate-cut pedestal, according to an embodiment of the disclosure.

FIG. 5 follows from FIG. 4 after deposition of a first dielectric layer 184 to fill the opening 128 in the patterning layer 120 to form a gate-cut pedestal in accordance with an embodiment of the disclosure. In an embodiment, the gate-cut pedestal includes the first dielectric layer 184 and the dielectric liner 108. The first dielectric layer 184 may also be deposited over top surfaces of the patterning layer 120 (not shown). The first dielectric layer may be made of silicon dioxide (SiO$_2$), silicon nitride (SiN) and any other suitable dielectric material and may be deposited by CVD, PVD, ALD or any other suitable deposition methods. A planarization process such as chemical mechanical planarization (CMP) may be used to remove the first dielectric layer 184 from the top surfaces of the patterning layer 120. The first dielectric layer 184 of the gate-cut pedestal has a height 168 which may be substantially equal to the height 174a of the first fin 112a or the height 174b of the second fin 112b.

Figure 6:
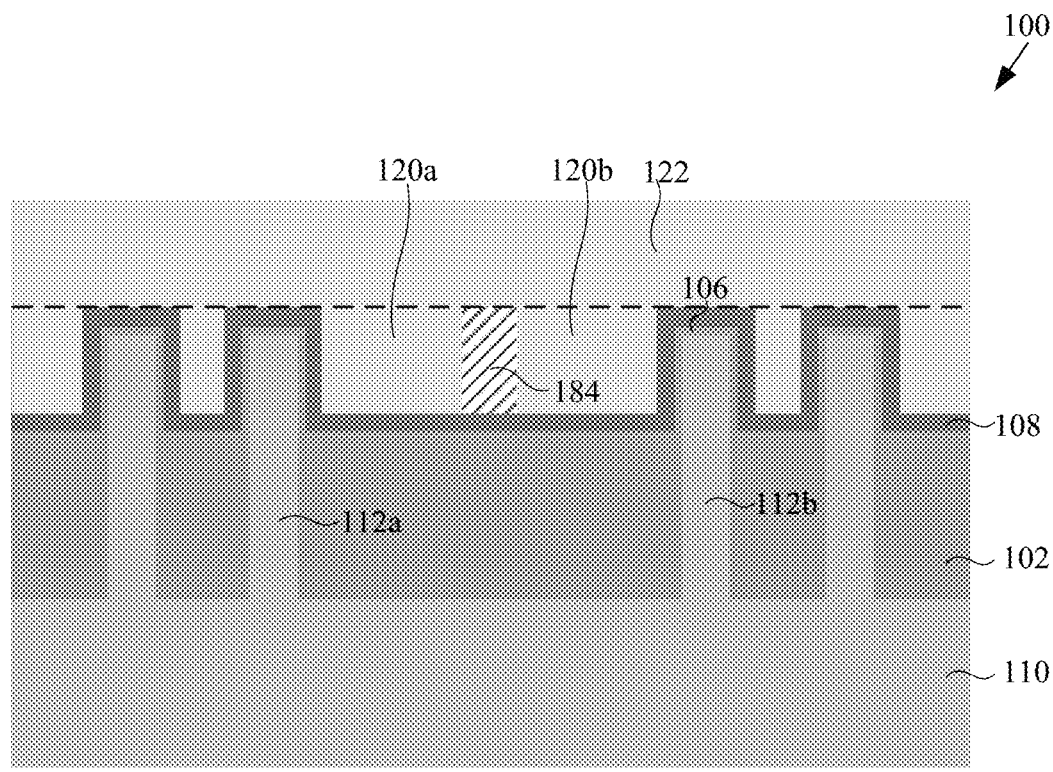
FIG. 6 is a cross-section view of a partially completed semiconductor device after deposition of a dummy gate layer, according to an embodiment of the disclosure.

FIG. 6 follows from FIG. 5 after conformally depositing a dummy gate layer 122 over the gate-cut pedestal, the patterning layer 120a over the first fin 112a and the patterning layer 120b over the second fin 112b, in accordance with an embodiment of the disclosure. The dummy gate layer 122 may also be made of amorphous silicon and may be deposited by CVD, PVD, ALD or any other suitable deposition methods.

Figure 7:
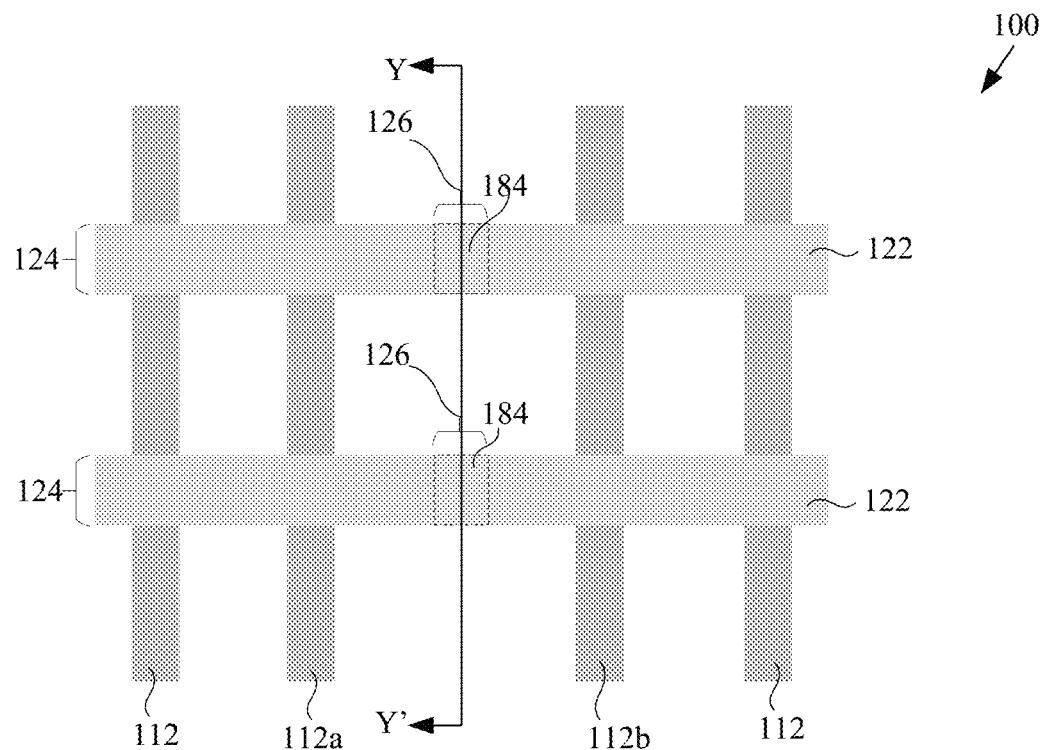
FIG. 7 is a top view of a partially completed semiconductor device according to an embodiment of the disclosure.

FIG. 7 is a top view of a partially completed semiconductor device 100 after formation of gate structures 124 according to an embodiment of the disclosure. Referring to FIG. 7, the gate structures 124 transverse the plurality of fins 112, including across the first fin 112a and the second fin 112b. The formation of the gate structures 124 exposes portions of the plurality of fins 112. Also shown is the section line Y-Y' that is used to present further aspects of the disclosure in the following figures. The locations of the first dielectric layer 184 of the gate-cut pedestals 126 are shown as dashed outlines.

Figure 8:
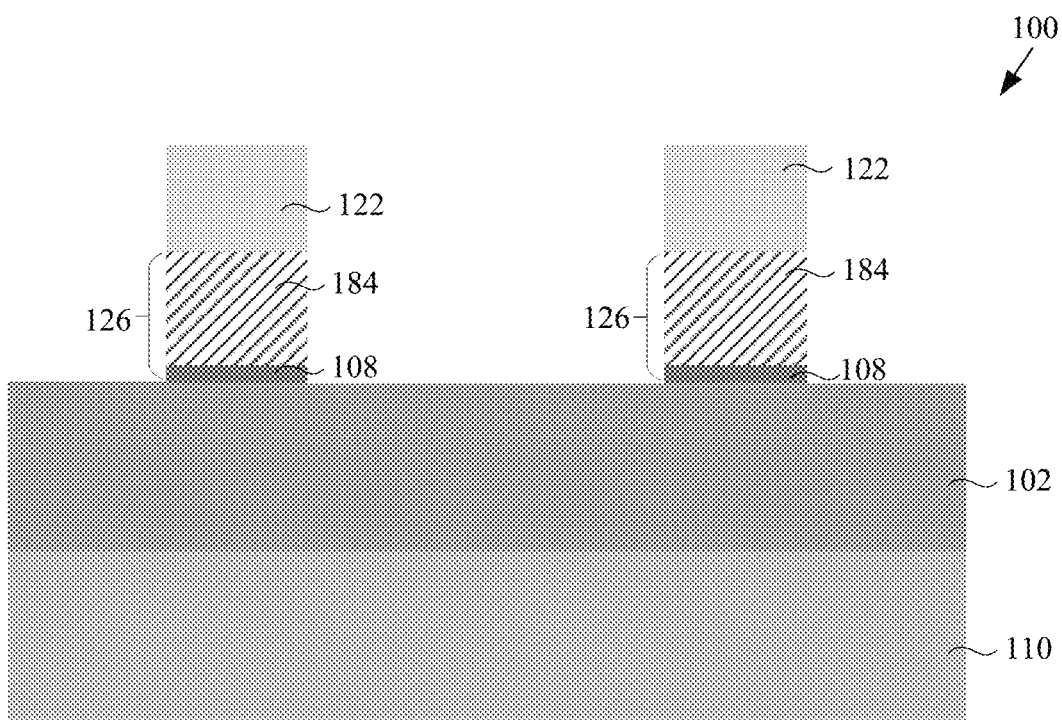
FIG. 8 is a cross-section view taken along section line Y-Y' of FIG. 7.

FIG. 8 is a cross-section view taken along section line Y-Y' of FIG. 7. The gate-cut pedestals 126 are disposed on the isolation material 102. The gate-cut pedestals 126 include the first dielectric layer 184 and the dielectric liner 108. Although not shown, patterning of the gate-cut pedestals 126 and the gate structures 124 may include depositing a layer of photoresist material on the dummy gate layer 122 followed by conventional photoresist exposure and developing to form photoresist patterns that are consistent with prior art practices. A wet etch or dry etch process may be used to remove portions of the dummy gate layer 122, the first dielectric layer 184 of the gate-cut pedestals and the dielectric liner 108 that are not covered by the photoresist patterns. Although not shown, the photoresist material is removed after the etching processes.

Figure 9:
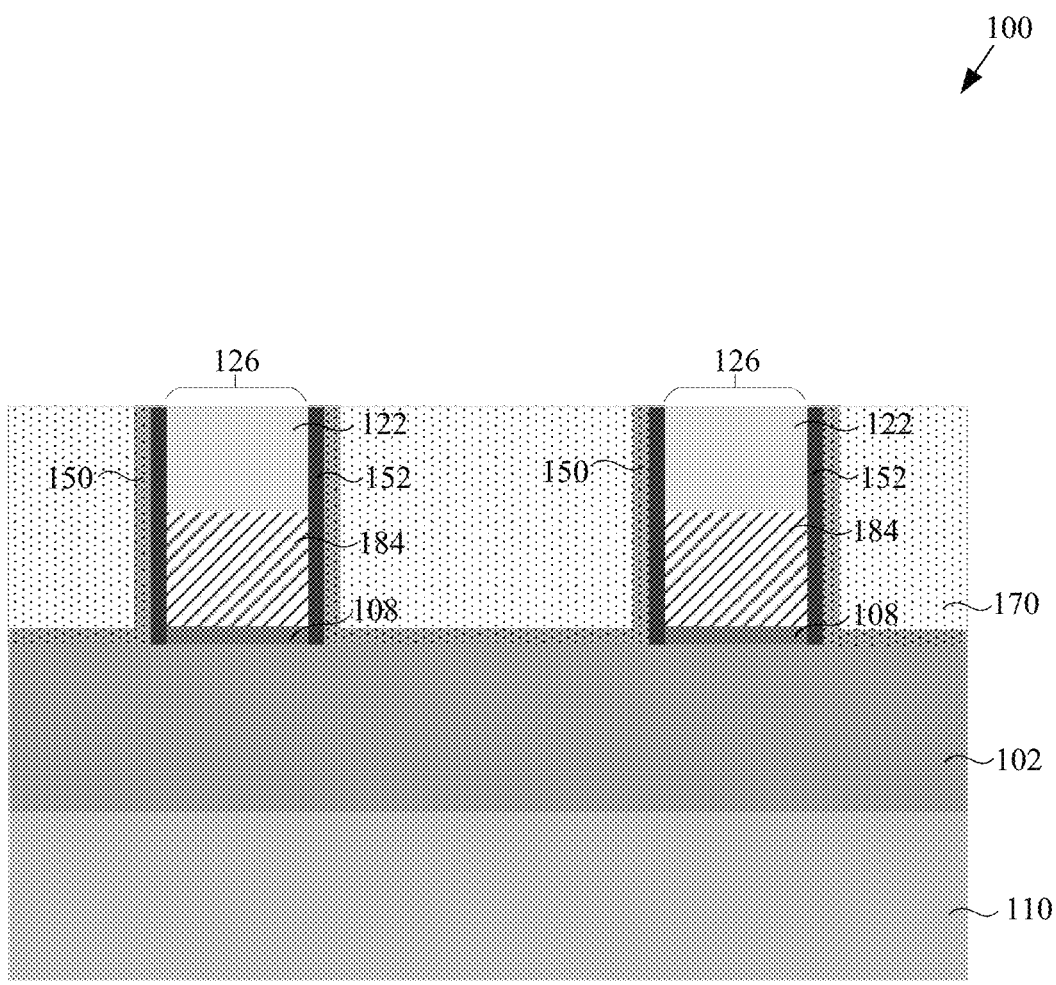
FIG. 9 is a cross-section view of a partially completed semiconductor device after spacer formation and interlayer dielectric deposition, according to an embodiment of the disclosure.

FIG. 9 follows from FIG. 8 after spacer structures 152 formation and interlayer dielectric deposition 170, in accordance with an embodiment of the disclosure. Referring to FIG. 9, spacer structures 152 may form sidewalls for the gate-cut pedestals 126 and the dummy gate layer 122. Spacer structure formation includes depositing a layer of low-k dielectric material, followed by anisotropic etching of the low-k dielectric material, consistent with prior art practices. The term "low-k" as used herein refers to a material having a dielectric constant (i.e., k value) that is lower than 7. Low-k dielectric materials may include SiN, silicon carbide (SiC), silicon oxynitride (SiON), silicon oxycarbonitride (SiOCN), silicon oxycarbide (SiOC) or boron-doped silicon carbonitride (SiBCN).

Although not shown, epitaxial structures may be grown on the exposed portions of the plurality of fins 112 to form source and/or drain regions. An etch stop layer 150 may be deposited over the epitaxial structures (not shown), the isolation material 102 and the spacer structures 152. In addition, the etch stop layer 150 may also be deposited over upper surfaces of the dummy gate layer 122 (not shown).

The etch stop layer 150 may be made of silicon nitride. The etch stop layer 150 prevents over etching into the epitaxial structures (not shown) and the isolation material 102 during source and/or drain contact formation.

Interlayer dielectric (ILD) material 170 may subsequently be deposited over the plurality of fins 112 (not shown), the dummy gate layer 122 and the etch stop layer 150. A planarization process such as CMP may be used to remove portions of the interlayer dielectric material 170 from upper surfaces of the dummy gate layer 122. The etch stop layer 150 may also be removed from the upper surfaces of the dummy gate layer 122 during the CMP process. The interlayer dielectric 170 may be made of SiO$_2$, SiON, borosilicate glass (BSG), phosphoric silicate glass (PSG), fluorinated silicate glass (FSG), low-k material, another suitable material or a combination thereof. In some embodiments, the interlayer dielectric 170 includes multiple sub-layers.

Figure 10A:
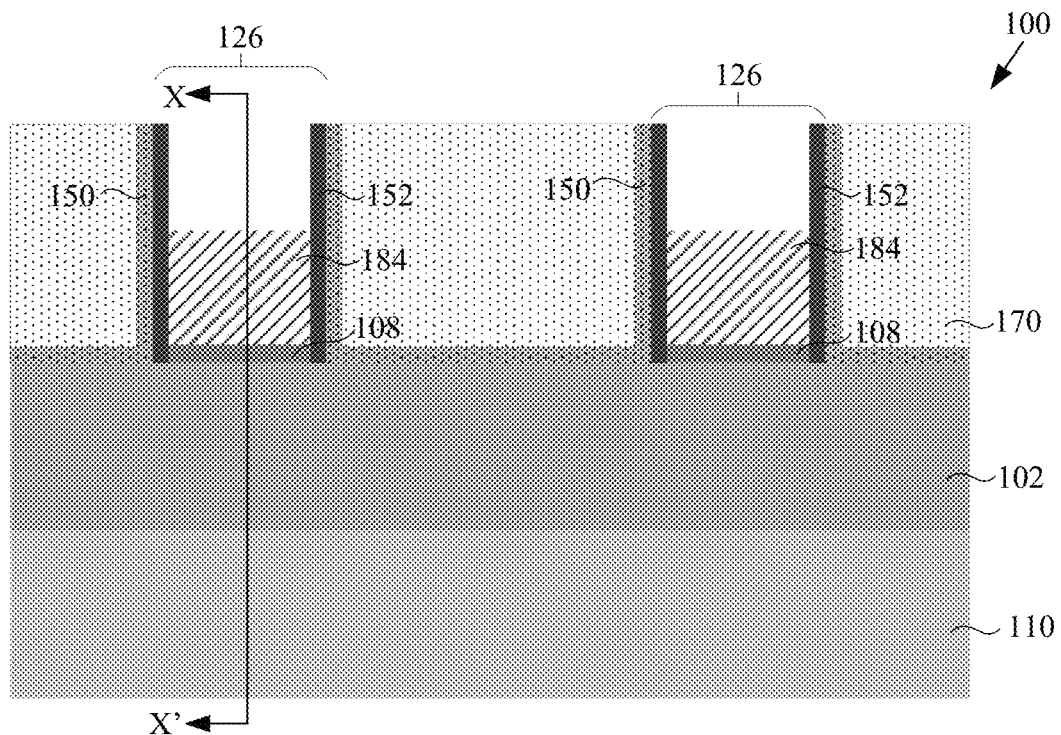
FIG. 10A is a cross-section view of a partially completed semiconductor device after removal of the dummy gate layer, according to an embodiment of the disclosure.
Figure 10B:
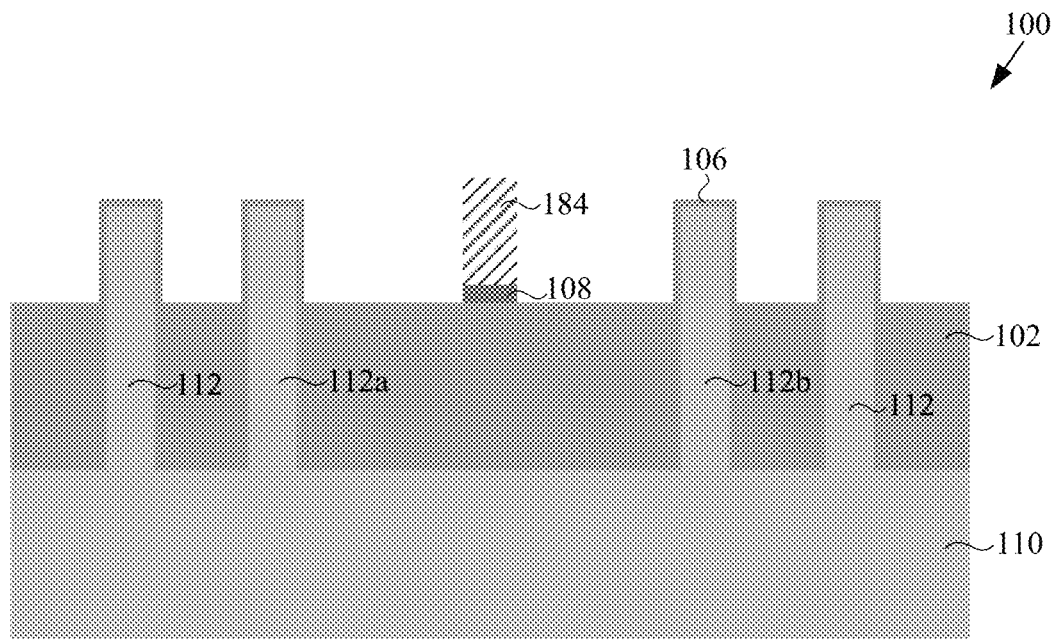
FIG. 10B is a cross-section view taken along section line X-X' of FIG. 10A according to an embodiment of the disclosure.

FIG. 10A follows FIG. 9 after removal of the dummy gate layer 122 from upper surfaces of the gate-cut pedestals 126, according to an embodiment of the disclosure. The removal processes may be performed by either wet or dry etch. The removal of the dummy gate layer 122 exposes upper portions of the spacer structures 152. FIG. 10B is a cross-section view taken along section line X-X' of FIG. 10A. Referring to FIG. 10B, the uncovered dielectric liner 108 over the first fin 112a, the second fin 112b and the isolation material 102 is removed leaving behind the dielectric liner 108 separating the first dielectric layer 184 of the gate-cut pedestal from the isolation material 102, The removal process may be performed by either wet or dry etch.

Figure 11A:
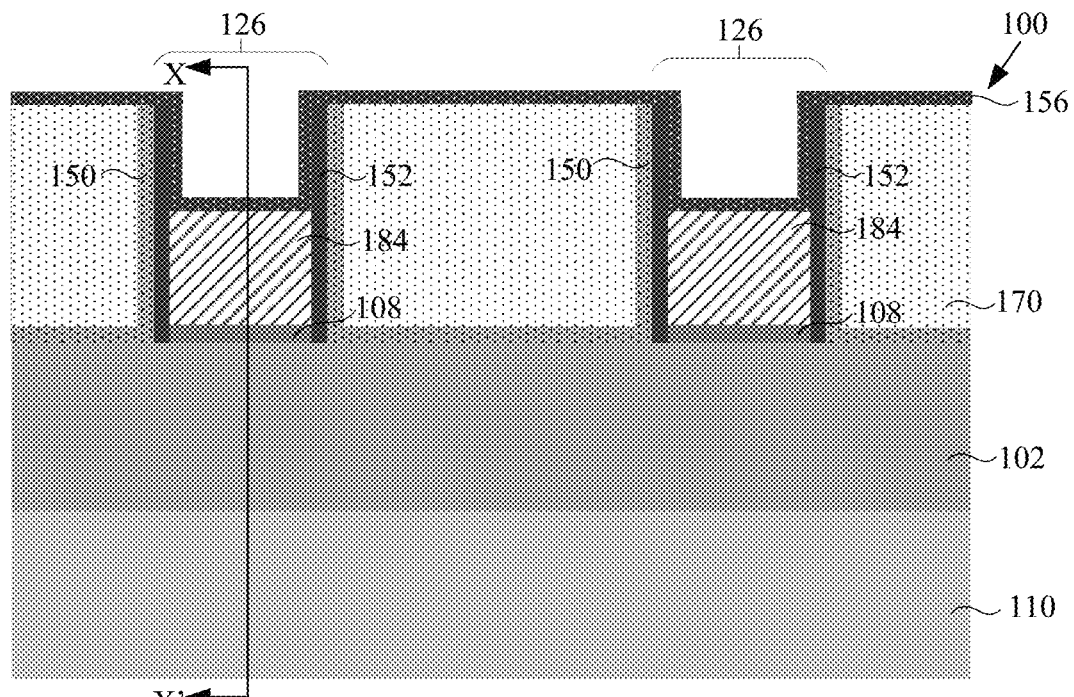
FIG. 11A is a cross-section view of a partially completed semiconductor device after gate electrode deposition, according to an embodiment of the disclosure.

FIG. 11A follows from FIG. 10A after gate electrode layer 156 deposition on upper portions of the spacer structures 152 and over the first dielectric layer 184 of the gate-cut pedestals 126, according to an embodiment of the disclosure. The gate electrode layer 156 may also be deposited over upper surfaces of the spacer structures 152, upper surfaces of the etch stop layer 150 and upper surfaces of the interlayer dielectric 170. In an embodiment, the gate electrode layer 156 may be made of titanium nitride (TiN), tantalum nitride (TaN), aluminum (Al), titanium aluminide (TIAl), aluminum-doped titanium carbide (TiAlC), magnesium (Mg), palladium (Pd), platinum (Pt), molybdenum (Mo), nickel (Ni) or any other suitable materials.

In an embodiment, the gate electrode layer 156 may be deposited by ALD, CVD or PVD. Although not shown, a gate dielectric layer may be deposited on upper portions of the spacer structures 152, over the first dielectric layer 184 of the gate-cut pedestals and upper surfaces of the interlayer dielectric 170 prior to the gate electrode layer 156 deposition.

Figure 11B:
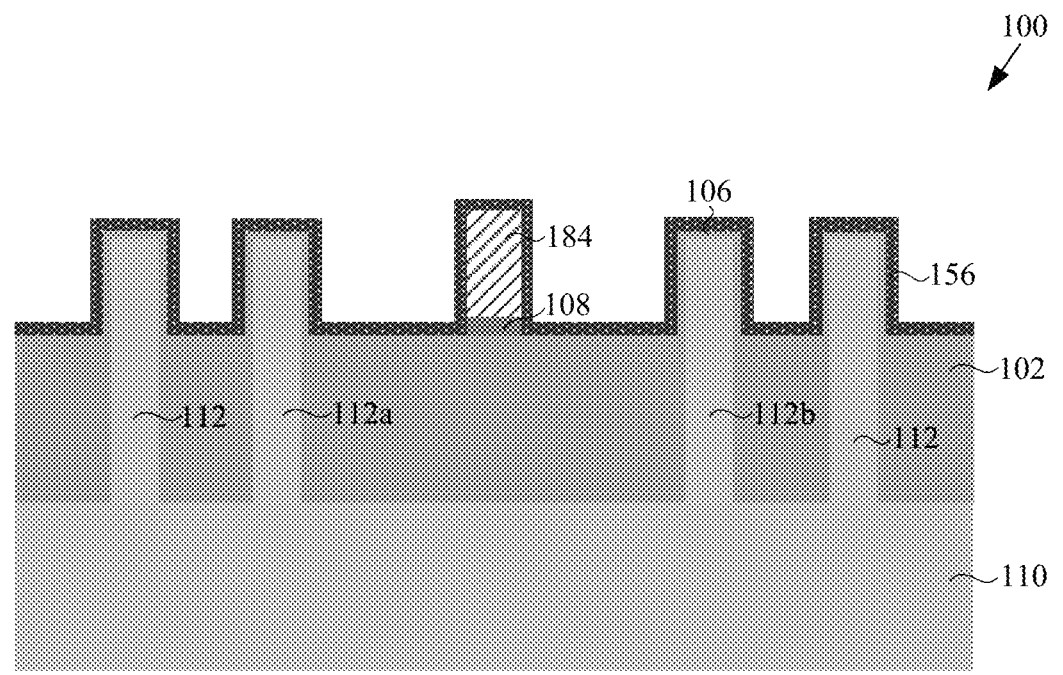
FIG. 11B is a cross-section view taken along section line X-X' of FIG. 11A according to an embodiment of the disclosure.

FIG. 11B is a cross-section view taken along section line X-X' of FIG. 11A. Referring to FIG. 11B, the gate electrode layer 156 may be deposited over the first dielectric layer 184 of the gate-cut pedestal, the plurality of fins 112, i.e., over the first fin 112a and the second fin 112b, side surfaces of the dielectric liner 108 and the isolation material 102. Although not shown, the gate dielectric layer may also be deposited over the first dielectric layer 184 of the gate-cut pedestal, the plurality of fins 112, i.e., over the first fin 112a and the second fin 112b, the side surfaces of the dielectric liner 108 and the isolation material 102 prior to the gate electrode layer 156 deposition.

Figure 12A:
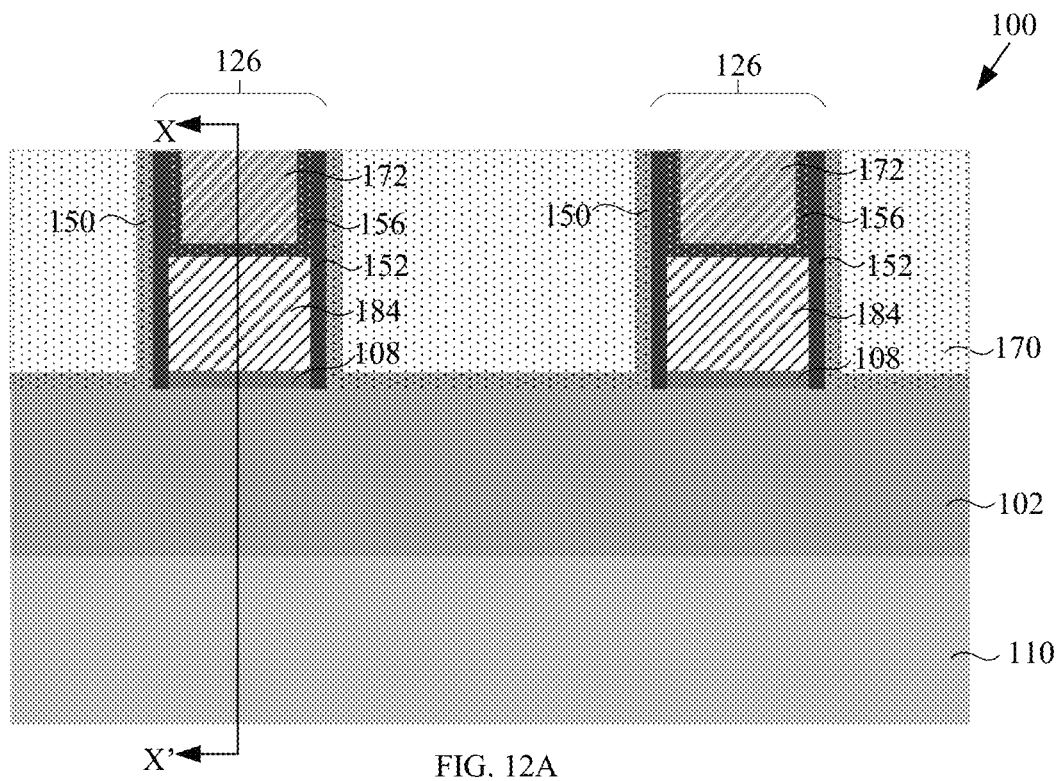
FIG. 12A is a cross-section view of a partially completed semiconductor device after metal contact layer deposition and planarization, according to an embodiment of the disclosure.

FIG. 12A follows from FIG. 11A after metal contact layer 172 deposition and planarization, according to an embodiment of the disclosure. Referring to FIG. 12A, the metal contact layer 172 may be deposited over the gate electrode layer 156 over the first dielectric layer 184 of the gate-cut pedestals and upper portions of the spacer structures 152. The metal contact layer 172 may also be deposited over the gate electrode layer 156 over upper surfaces of the spacer structures 152, upper surfaces of the etch stop layer 150 and upper surfaces of the interlayer dielectric 170 (not shown). The metal contact layer 172 may function as a gate contact.

In an embodiment, the metal contact layer 172 may be made of tungsten or W. In an alternative embodiment, the metal contact layer 172 may be made of cobalt (Co), ruthenium (Ru), Al or copper (Cu). In an embodiment, the metal contact layer 172 may be deposited by CVD, ALD or PVD. The planarization process removes the gate electrode layer 156 and the metal contact layer 172 from upper surfaces of the interlayer dielectric 170 (not shown). In an embodiment, the planarization process may be done by CMP.

Figure 12B:
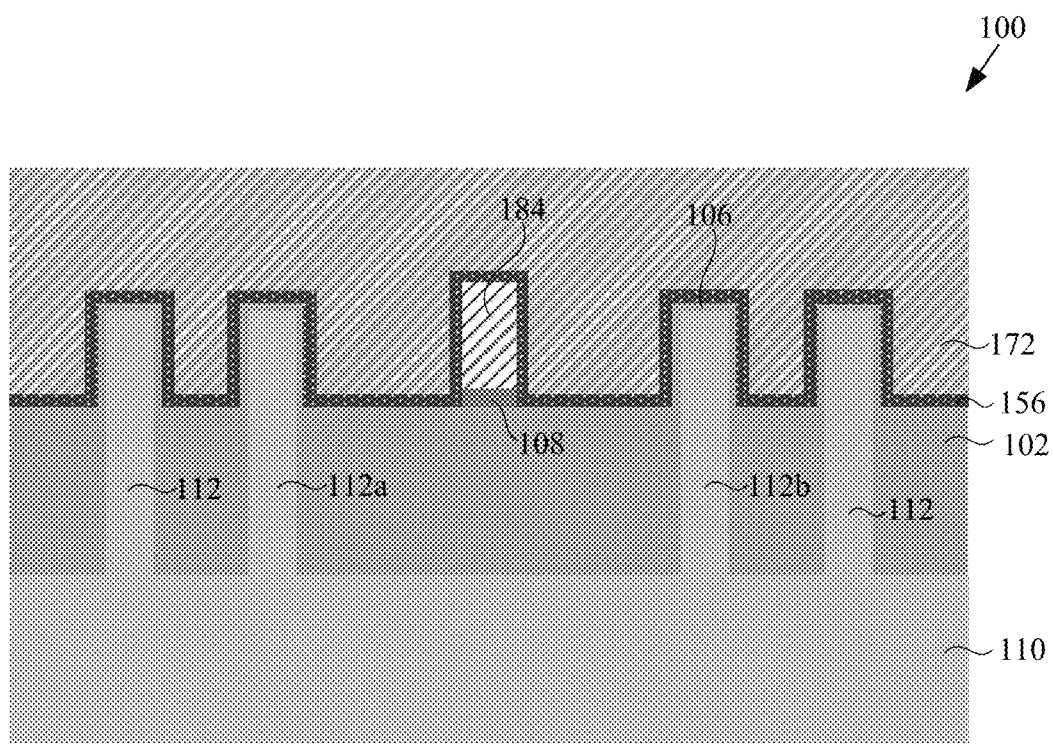
FIG. 12B is a cross-section view taken along section line X-X' of FIG. 12A according to an embodiment of the disclosure.

FIG. 12B is a cross-section view taken along section line X-X' of FIG. 12A. Referring to FIG. 12B, the metal contact layer 172 may be deposited over semiconductor device 100, i.e., the gate electrode layer 156 over the first dielectric layer 184 of the gate-cut pedestal, the plurality of fins 112, including over the first fin 112a and the second fin 112b, the side surfaces of the dielectric liner 108 and the isolation material 102 covering the fins.

Figure 13A:
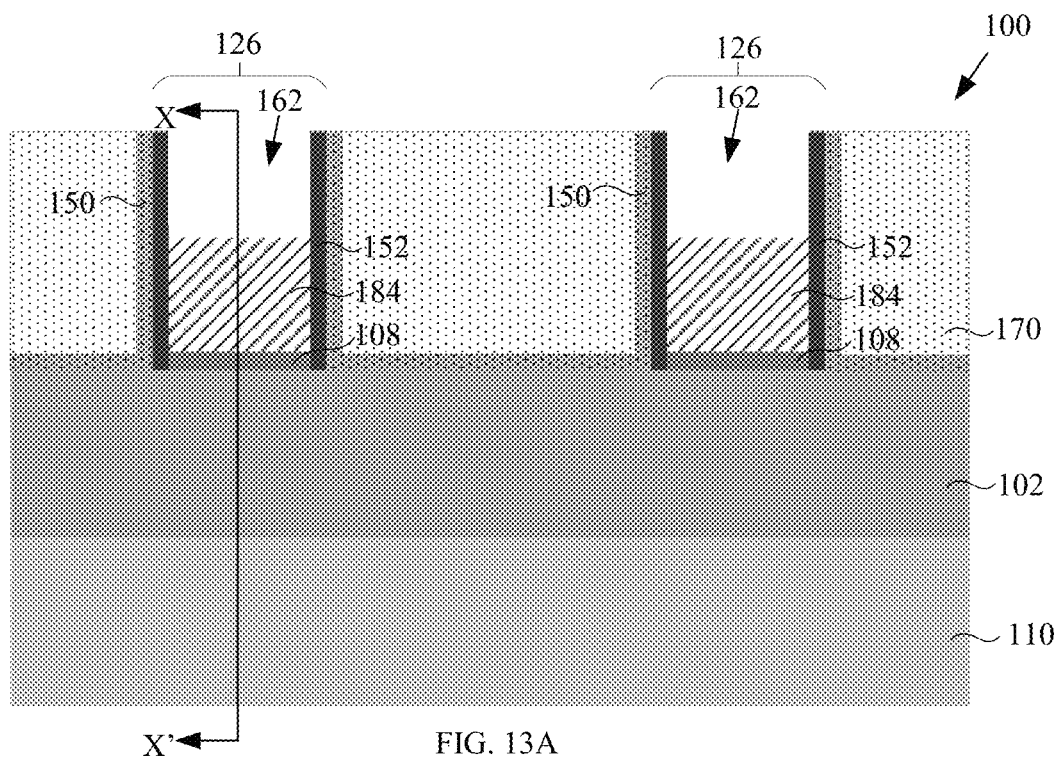
FIG. 13A is a cross-section view of a partially completed semiconductor device after formation of an opening in the metal contact layer, according to an embodiment of the disclosure.

FIG. 13A follows from FIG. 12A after formation of an opening 162 in the metal contact layer 172, according to an embodiment of the disclosure. Although not shown, formation of the opening 162 in the metal contact layer 172 may include depositing a layer of photoresist material on the top surface of the device 100, followed by conventional photoresist exposure and developing to form the required photoresist patterns. A dry etch process may be used to remove portions of the metal contact layer 172 and the gate electrode layer 156 that are not covered by the photoresist patterns. Hence, the metal contact layer 172 and the gate electrode layer 156 are removed from upper surfaces of the first dielectric layer 184 of the gate-cut pedestals and from the upper portions of the spacer structures 152. Although not shown, the photoresist material is removed after the etching processes.

Figure 13B:
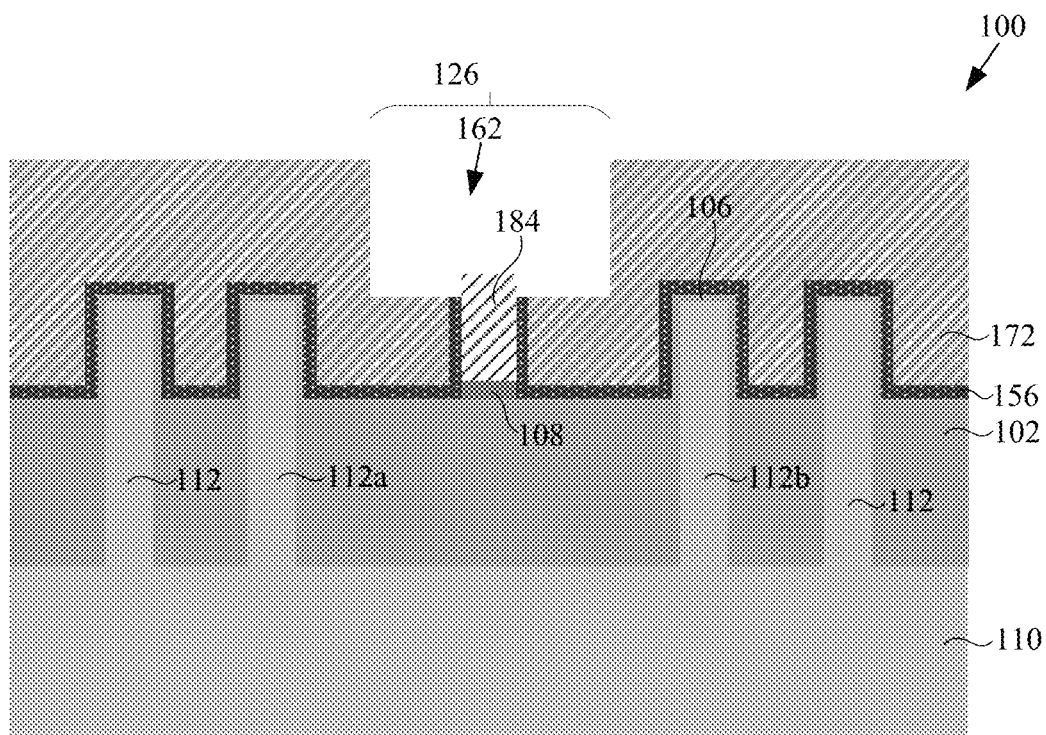
FIG. 13B is a cross-section view taken along section line X-X' of FIG. 13A according to an embodiment of the disclosure.

FIG. 13B is a cross-section view taken along section line X-X' of FIG. 13A. Referring to FIG. 13B, the opening 162 in the metal contact layer 172 exposes a portion of the side surfaces and a top surface of the first dielectric layer 184 of the gate-cut pedestal. The metal contact layer 172 and the gate electrode layer 156 may be removed, leaving behind the gate electrode layers 156 over a portion of side surfaces of the first dielectric layer 184 of the gate-cut pedestal and the plurality of fins 112, including the first fin 112a and the second fin 112b. The first dielectric layer 184 of the gate-cut pedestal and the dielectric liner 108 separates the gate electrode layer 156 over the first fin 112a and the gate electrode layer 156 over the second fin 112b.

Figure 14A:
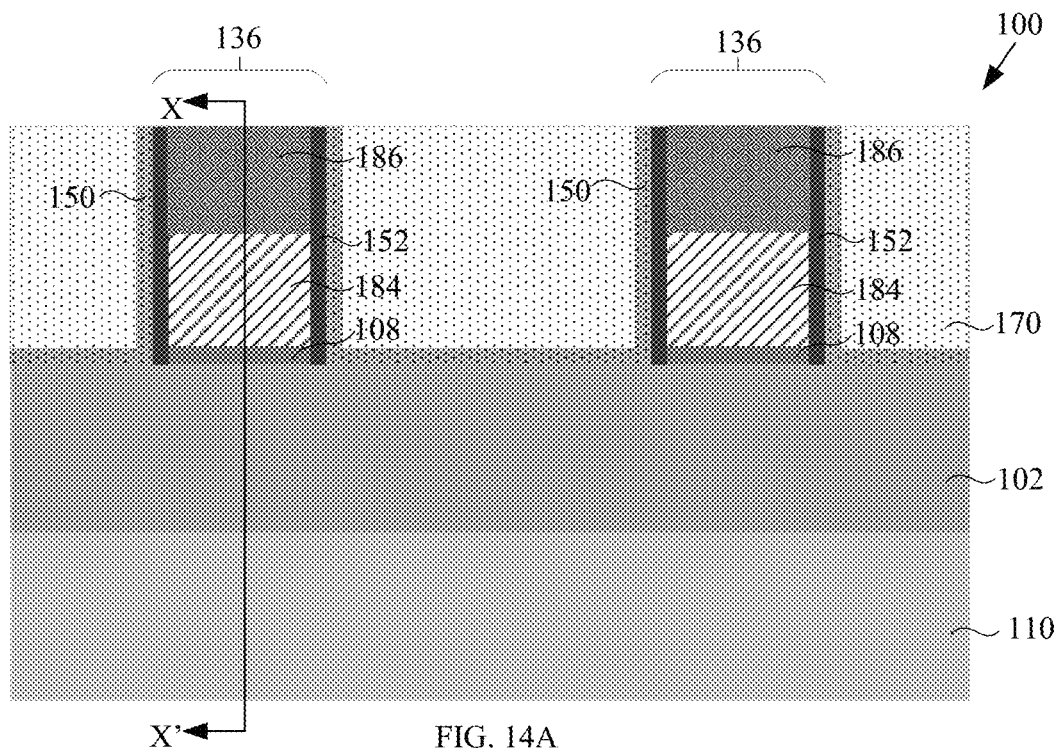
FIG. 14A is a cross-section view of a semiconductor device after deposition of a second dielectric layer in the opening in the metal contact layer to form a gate-cut block, according to an embodiment of the disclosure.

FIG. 14A follows from FIG. 13A after deposition of a second dielectric layer, according to an embodiment of the disclosure. The second dielectric layer is deposited over the first dielectric layer 184 of the gate-cut pedestals to fill up the opening 162 in the metal contact layer 172 to form gate-cut blocks 186, thereby completing a gate-cut structure 136. The second dielectric layer may be made of $SiO_2$, SiN and any other suitable dielectric material and may be deposited by CVD, PVD, ALD or any other suitable deposition methods. In an embodiment, the first dielectric layer and the second dielectric layer may be made of different dielectric materials. Spacer structures 152 form sidewalls for the gate-cut structures 136.

While not shown, the second dielectric layer may also be deposited over upper surfaces of the spacer structures 152, upper surfaces of the etch stop layer 150 and upper surfaces of the interlayer dielectric 170. A planarization process such as CMP may be used to remove the second dielectric layer from the upper surfaces of the spacer structures 152, the upper surfaces of the etch stop layer 150 and the upper surfaces of the interlayer dielectric 170.

Figure 14B:
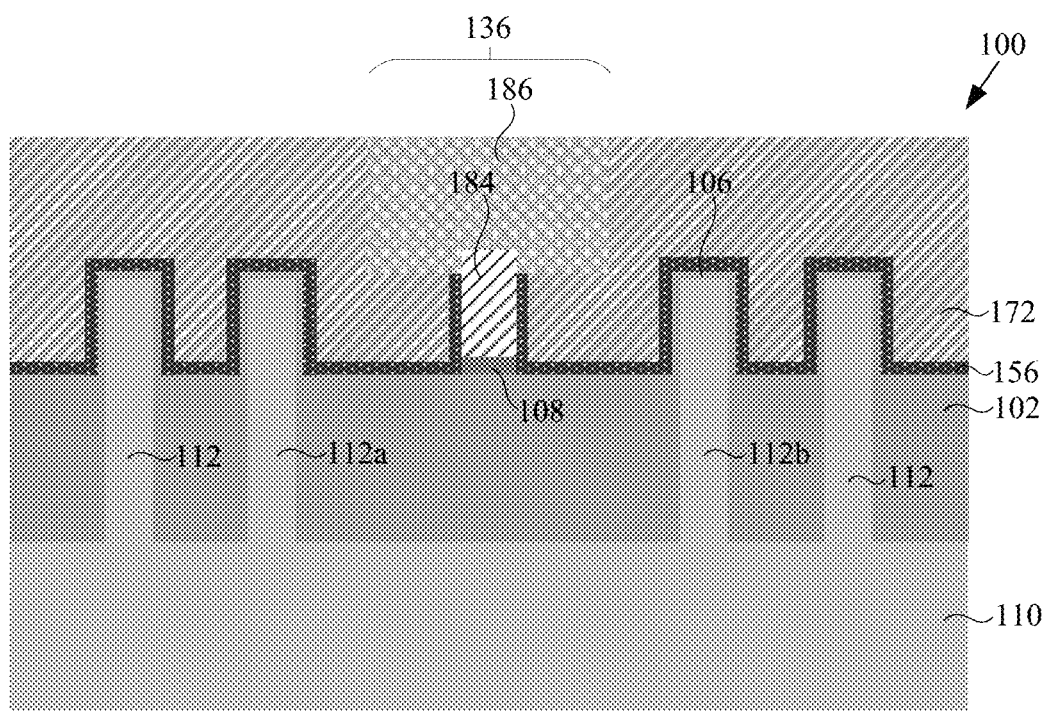
FIG. 14B is a cross-section view taken along section line X-X' of FIG. 14A according to an embodiment of the disclosure.

FIG. 14B is a cross-section view taken along section line X-X' of FIG. 14A. Referring to FIG. 14B, the gate-cut block 186 may be wider than the first dielectric layer 184 of the gate-cut pedestal. The upper section of the first dielectric layer 184 of the gate-cut pedestal may extend into the gate-cut block 186. As the metal gate layers i.e., the gate electrode layer 156 and the metal contact layer 172, are deposited prior to the formation of the gate-cut block 186, any concerns associated with metal gate deposition into a narrow spacing between the gate-cut block 186 and the first fin 112a or the second fin 112b are avoided. The present disclosure allows the gate electrode layer 156 and metal contact layer 172 to be deposited uniformly.

In an embodiment, the gate-cut pedestal positioned between the first fin 112a and the second fin 112b may be a gate-cut precursor as it facilitates an easier gate-cut process. The gate electrode layer 156 and the metal contact layer 172 may subsequently be deposited over the first fin 112a, the second fin 112b and the gate-cut pedestal. Both the gate electrode layer 156 and the metal contact layer 172 are easily separated by forming an opening in the metal contact layer 172 to expose upper side surfaces and a top surface of the gate-cut pedestal. The gate electrode layer 156 may subsequently be removed from the top surface and upper side surfaces of the gate-cut pedestal. The opening in the metal contact layer 172 may be wider than the gate-cut pedestal. A gate-cut block 186 may subsequently be formed above the gate-cut pedestal to complete the gate-cut structure 136.

Figure 15:
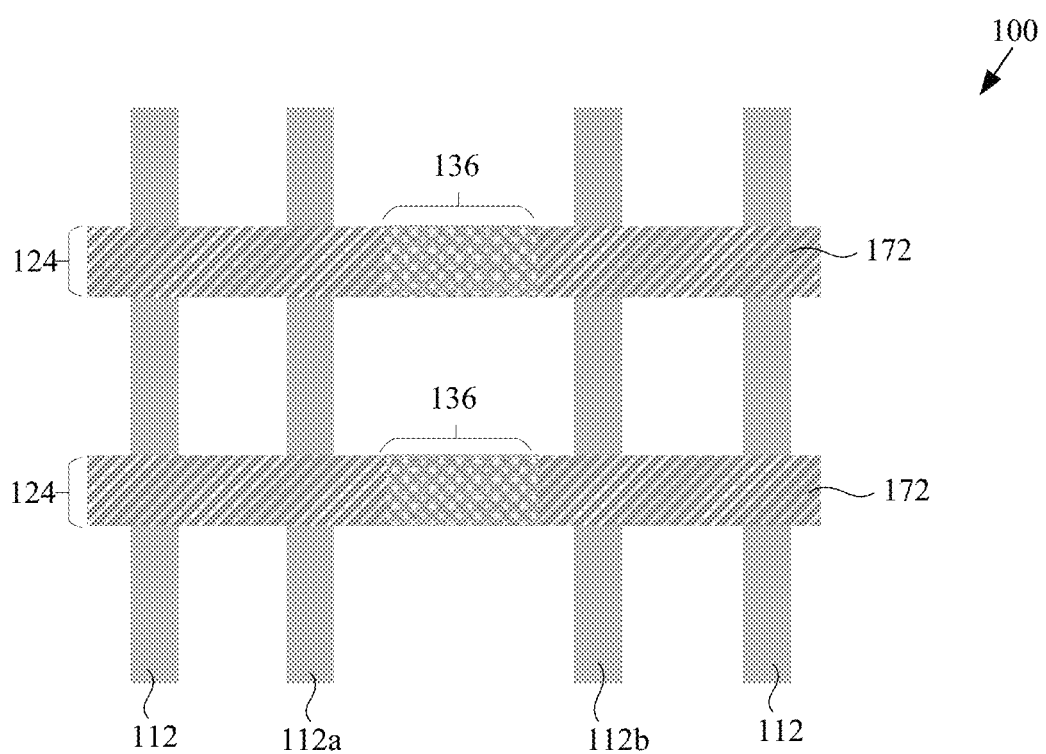
FIG. 15 is a top view of a semiconductor device according to an embodiment of the disclosure.

FIG. 15 is a top view of a semiconductor device 100 according to an embodiment of the disclosure. Referring to FIG. 15, the locations of the gate-cut structures 136 are shown in the gate structures 124. In particular, the gate-cut structures 136 are shown separating the metal contact layer 172 over the first fin 112a and the metal contact layer 172 over the second fin 112b.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   a substrate;
   a first fin and a second fin disposed on the substrate;
   a gate electrode over the first fin and the second fin;
   a gate-cut pedestal positioned between the first fin and the second fin, the gate-cut pedestal including a first dielectric layer over a dielectric liner, wherein the dielectric liner and the first dielectric layer are made of different dielectric materials and a portion of side surfaces of the first dielectric layer of the gate-cut pedestal is in direct contact with the gate electrode;
   an isolation material between the first fin and the second fin, wherein the dielectric liner is above the isolation material and the gate electrode is in direct contact with the isolation material;
   spacer structures directly contacting the first dielectric layer and the dielectric liner; and
   the gate-cut pedestal having a height that is substantially similar to a height of the first fin.

2. The semiconductor device of claim 1, further comprising:
   a gate-cut block positioned above the gate-cut pedestal, wherein the gate-cut block is wider than the gate-cut pedestal.

3. The semiconductor device of claim 2, wherein the gate-cut pedestal has an upper section that is uncovered by the gate electrode that extends into the gate-cut block.

4. The semiconductor device of claim 2,
   wherein the gate-cut block includes a second dielectric layer.

5. The semiconductor device of claim 2, further comprising:
   a metal contact layer covering the gate electrode over the first fin and the second fin, wherein the gate-cut pedestal and the gate-cut block separate the metal contact layer over the first fin and the metal contact layer over the second fin.

6. The semiconductor device of claim 4, wherein the first dielectric layer and the second dielectric layer are different materials.

7. The semiconductor device of claim 1, wherein the dielectric liner comprises aluminum oxide ($Al_2O_3$) or titanium oxide ($TiO_2$).

8. The semiconductor device of claim 4, wherein the first dielectric layer comprises silicon dioxide ($SiO_2$) or silicon nitride (SiN).

9. The semiconductor device of claim 1, wherein the dielectric liner directly contacts the isolation material.

10. The semiconductor device of claim 2, wherein the spacer structures are in direct contact with the gate-cut block.

11. The semiconductor device of claim 1, wherein the dielectric liner has a first end portion and a second end portion opposite to the first end portion, wherein the first end portion and the second end portion of the dielectric liner are directly below the first dielectric layer and the gate electrode is in direct contact with the first end portion and the second end portion of the dielectric liner.

* * * * *